United States Patent [19]
Dandl

[11] Patent Number: 5,370,765
[45] Date of Patent: * Dec. 6, 1994

[54] ELECTRON CYCLOTRON RESONANCE PLASMA SOURCE AND METHOD OF OPERATION

[75] Inventor: Raphael A. Dandl, San Marcos, Calif.

[73] Assignee: Applied Microwave Plasma Concepts, Inc., San Marcos, Calif.

[*] Notice: The portion of the term of this patent subsequent to Jul. 28, 2009 has been disclaimed.

[21] Appl. No.: 48,744

[22] Filed: Apr. 16, 1993

Related U.S. Application Data

[63] Continuation-in-part of Ser. No. 875,750, Apr. 29, 1992, Pat. No. 5,203,960, which is a continuation of Ser. No. 320,947, Mar. 9, 1989, Pat. No. 5,133,826.

[51] Int. Cl.$^5$ .............................................. H05H 1/00
[52] U.S. Cl. .................................. 156/643; 156/646; 156/345; 118/723 MA; 427/571; 427/575
[58] Field of Search ................ 156/345, 643, 646; 118/723 MR, 723 MA; 204/298.37, 298.38, 298.16; 427/571, 575

[56] References Cited

U.S. PATENT DOCUMENTS 4,745,337  5/1988  Pichot et al. ................ 156/345 X
4,776,918  10/1988  Otsubo et al. ................ 156/345
5,133,826  7/1992  Dandl ........................ 156/345

Primary Examiner—Thi Dang
Attorney, Agent, or Firm—Robert Charles Hill

[57] ABSTRACT

A method and apparatus are disclosed employing electron cyclotron resonant (ECR) heating to produce plasma for applications including but not limited to chemical vapor deposition and etching. A magnetic field is formed by magnets circumferentially arranged about a cylindrical and symmetrical chamber with microwave power injected perpendicularly to a longitudinal axis of the chamber for preventing line-of-sight communication of resulting energetic electrons with a specimen being treated. The microwave power is distributed uniformly around the circumference of the chamber by applicators formed by one or more pairs of annular sectors, each of which comprises a slotted wave guide antenna, and coupled to an external source of microwave power by a hybrid coupler. A magnetic field free region produces uniformity of plasma distribution in a plasma stream approaching the outlet. The above characteristics are maintained for the plasma stream over substantial transverse dimensions larger than the specimen. A rectilinear applicator array is also disclosed for selected applications.

17 Claims, 10 Drawing Sheets

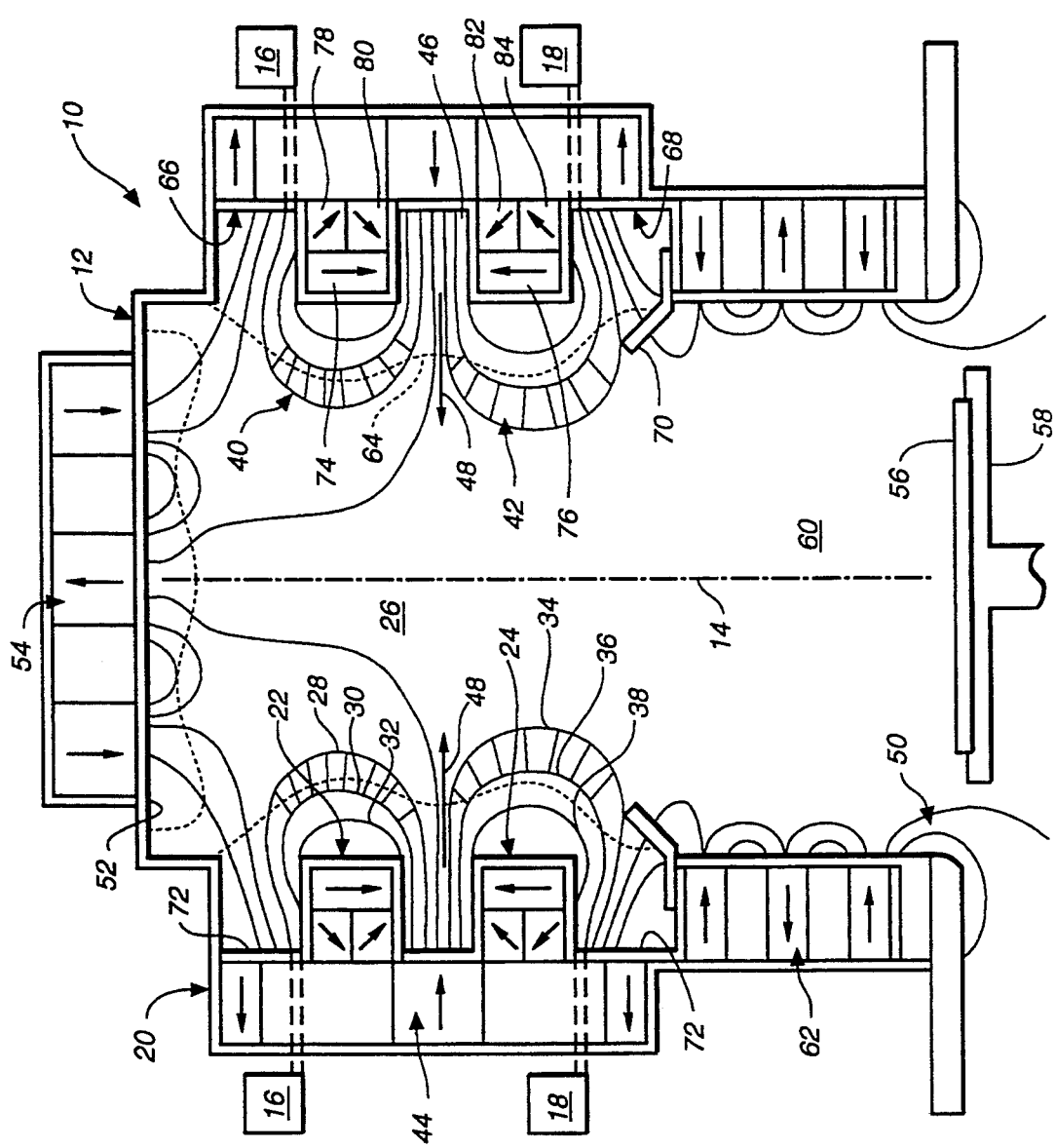
FIG._1

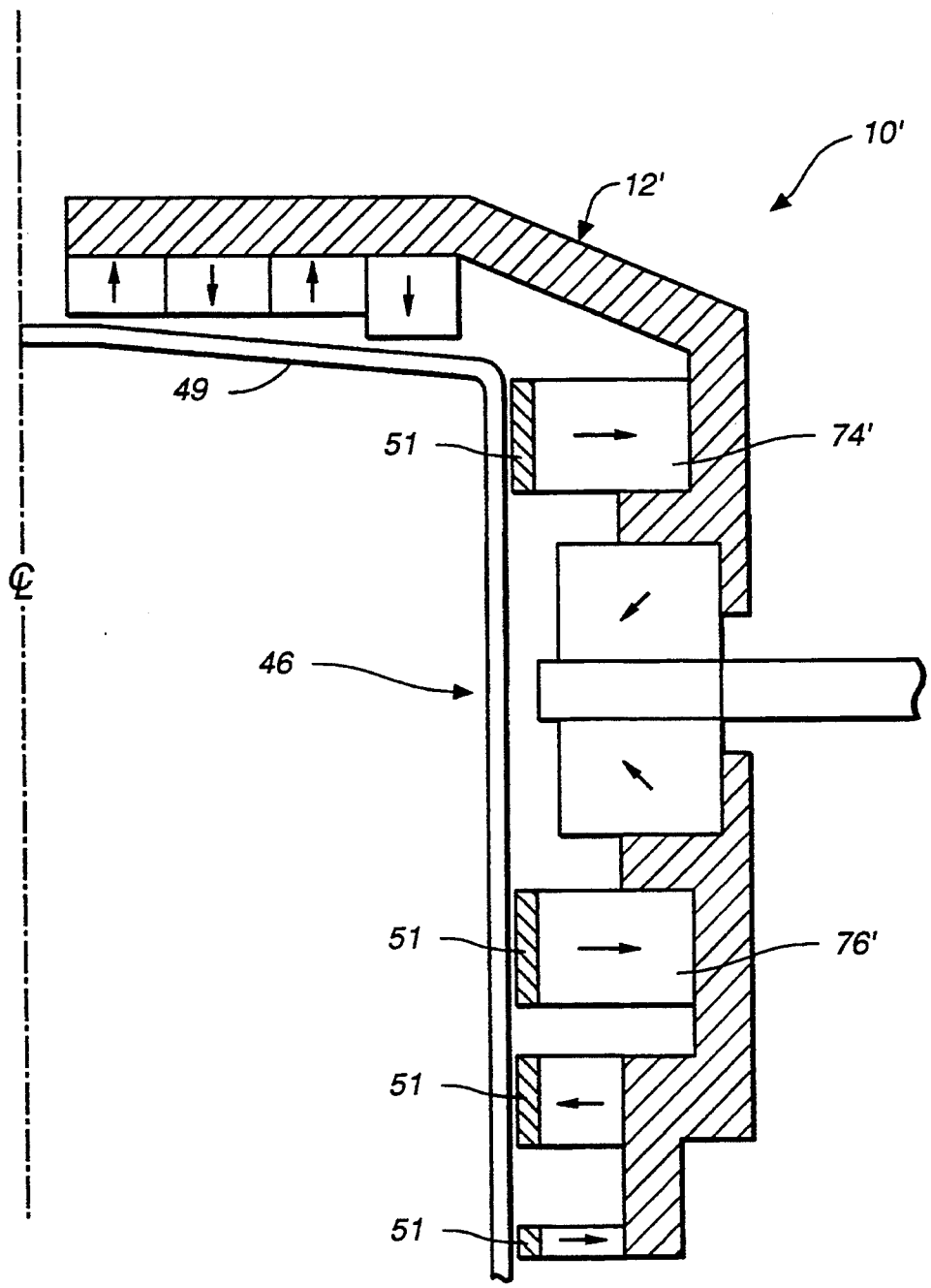
FIG._2

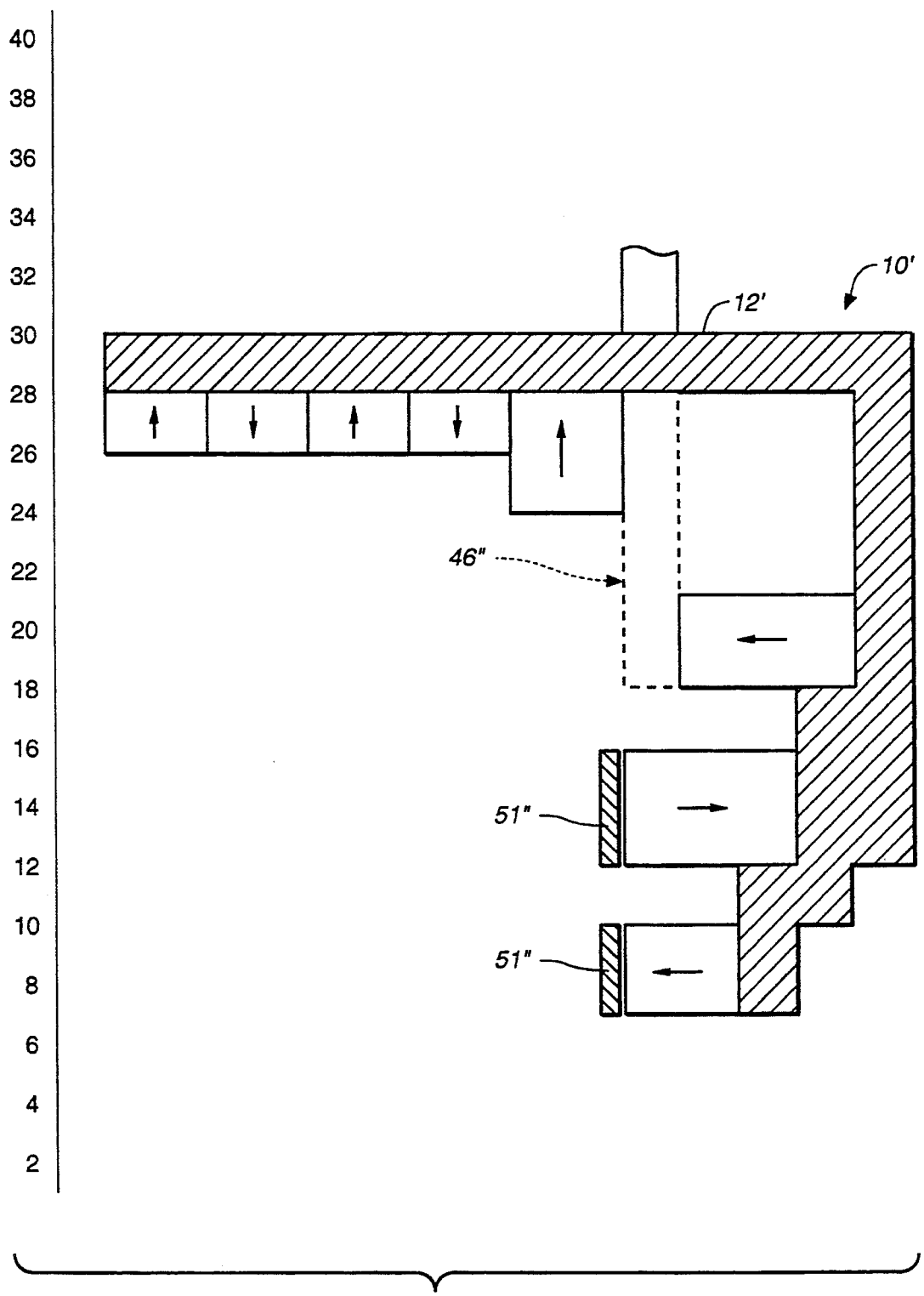
FIG._3

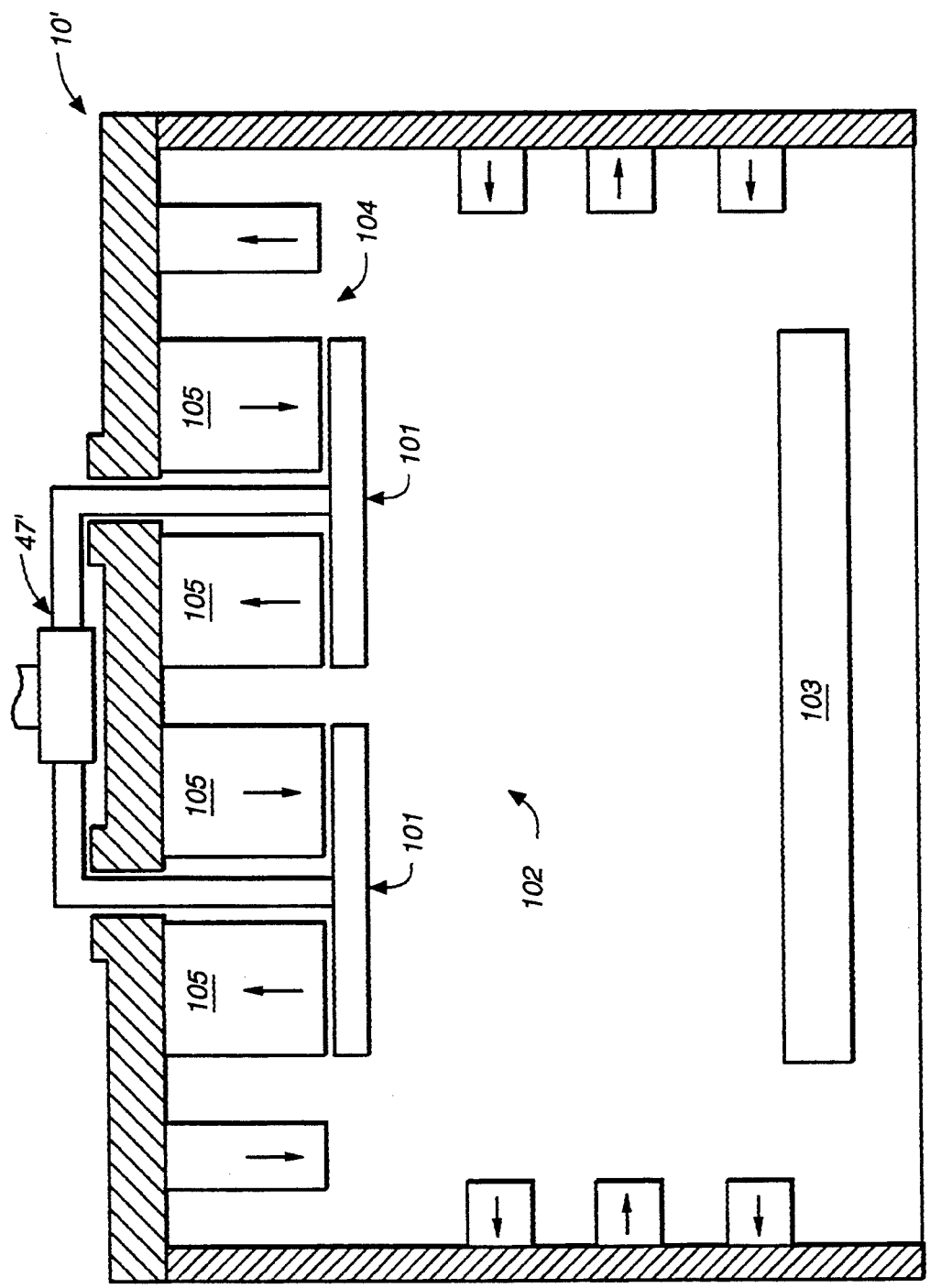
FIG._4A

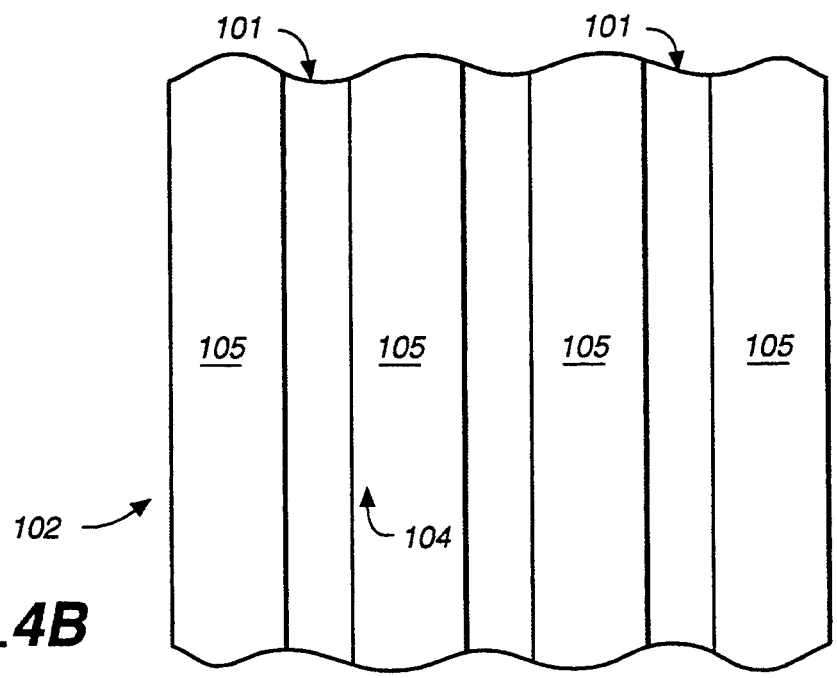
FIG._4B
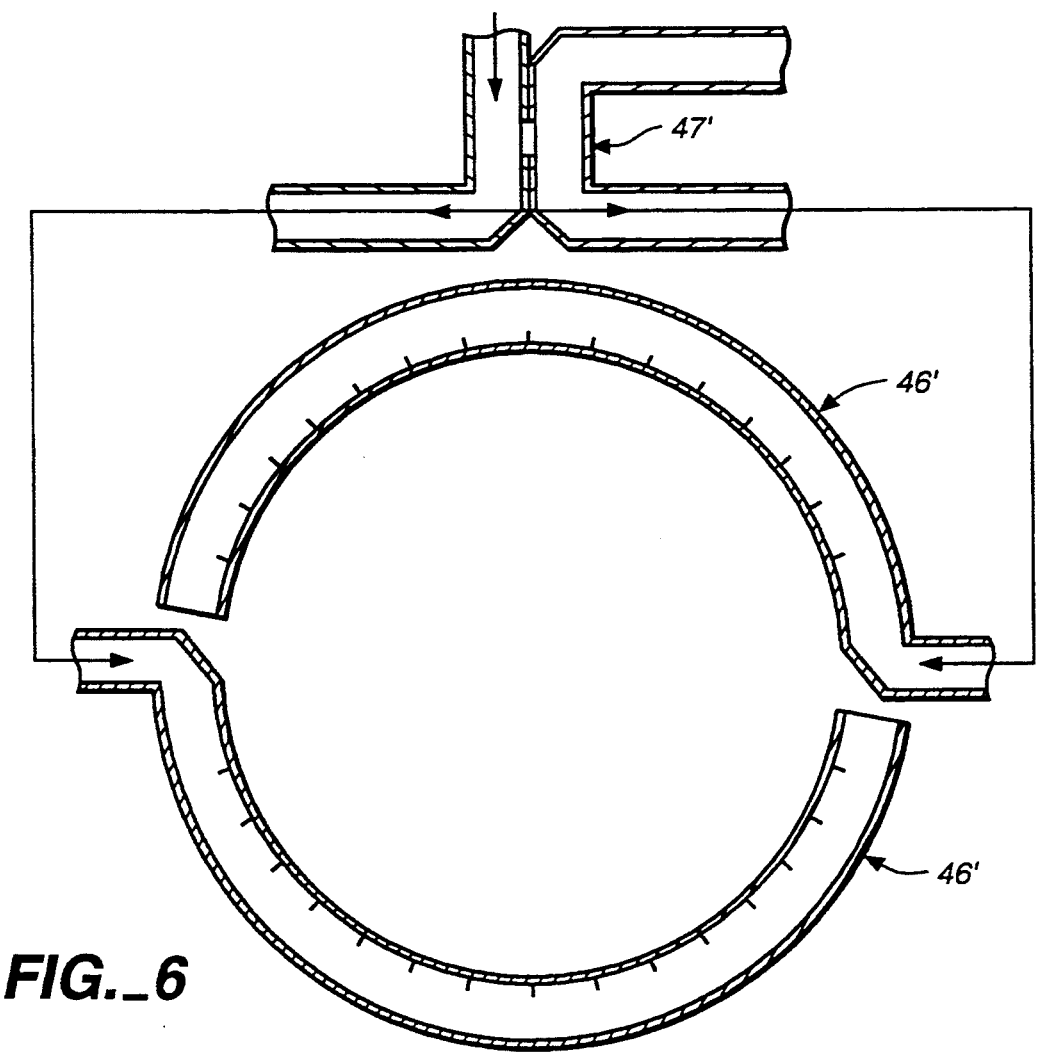
FIG._6

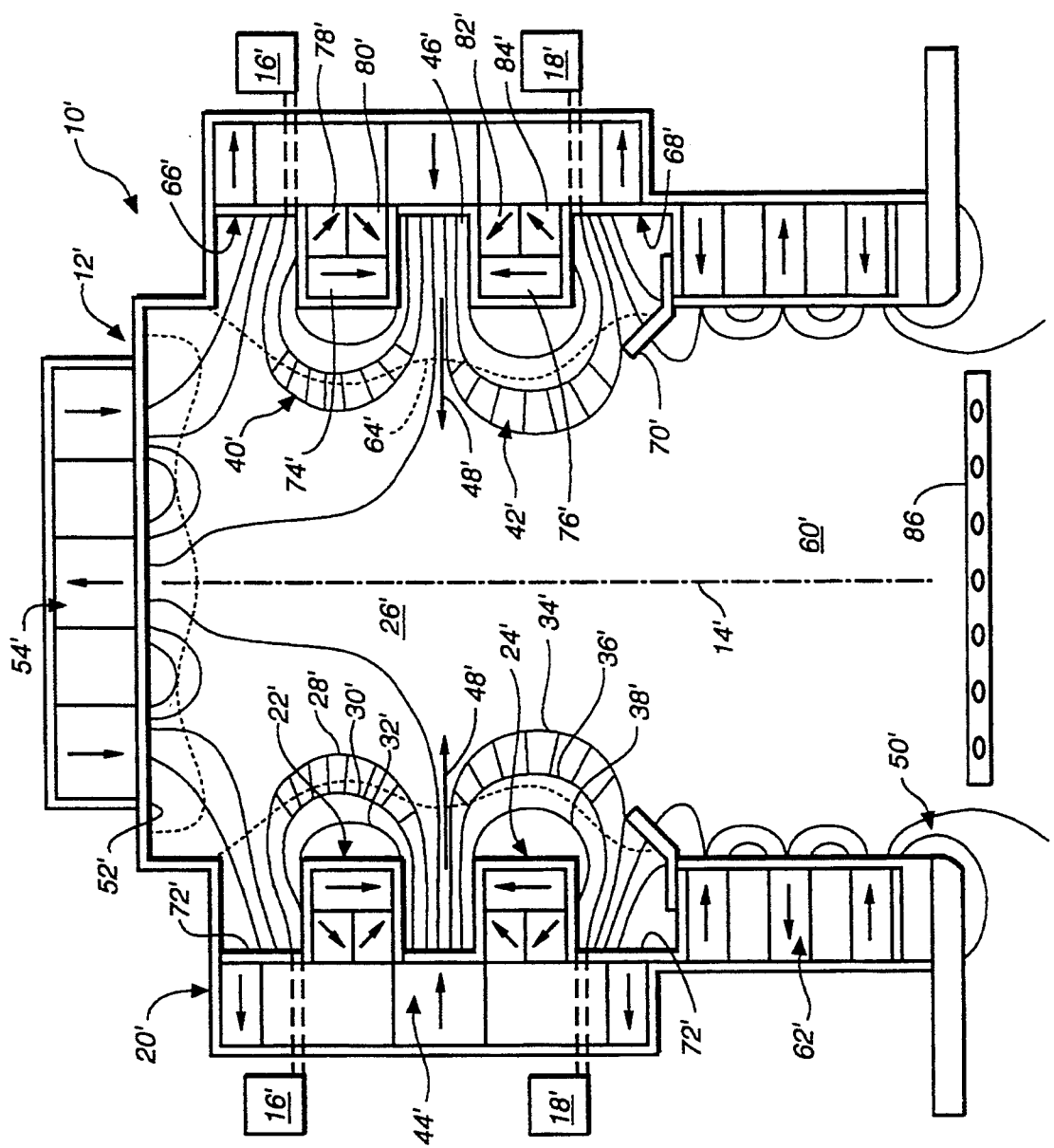
FIG._5

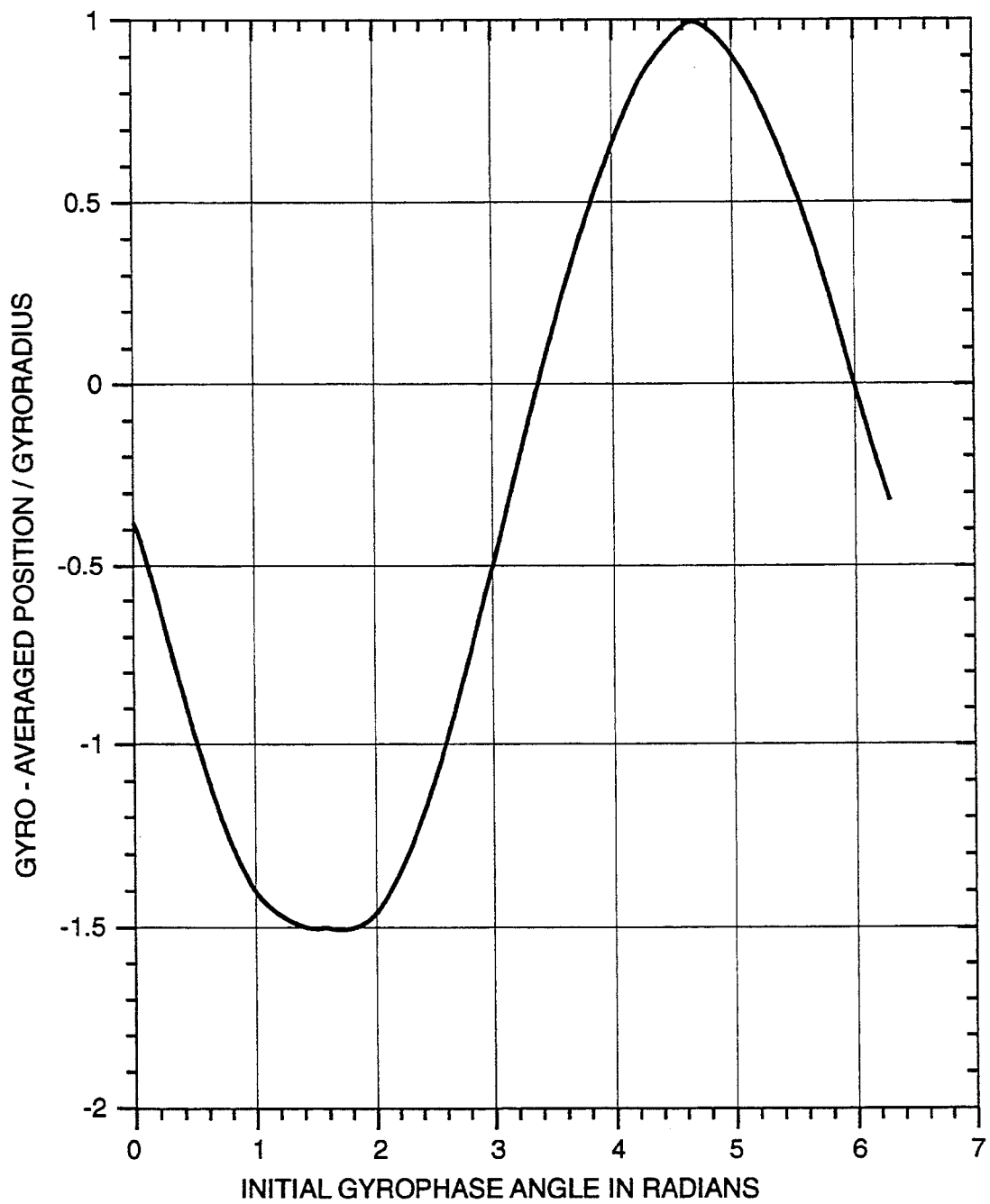
FIG._7

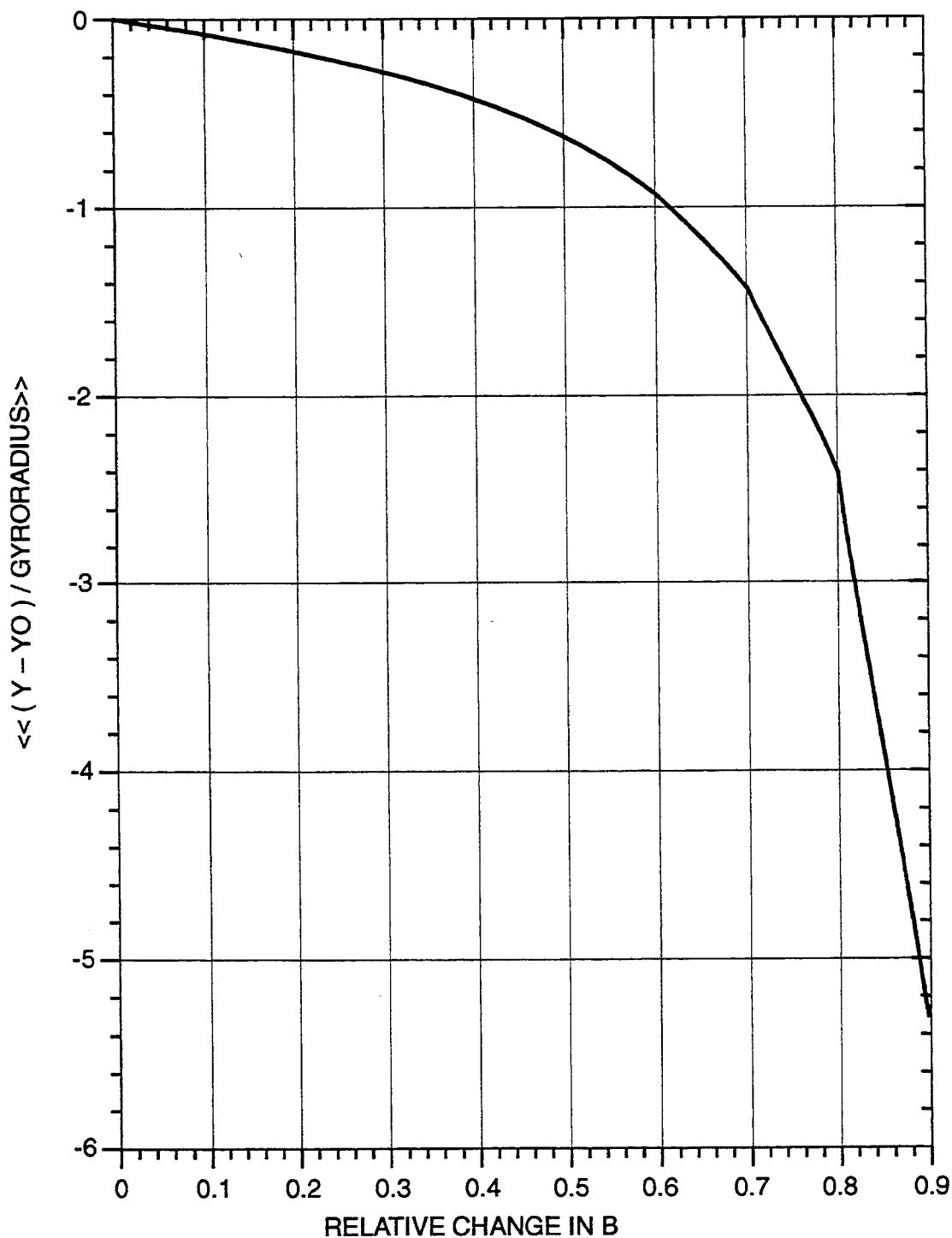
FIG._8

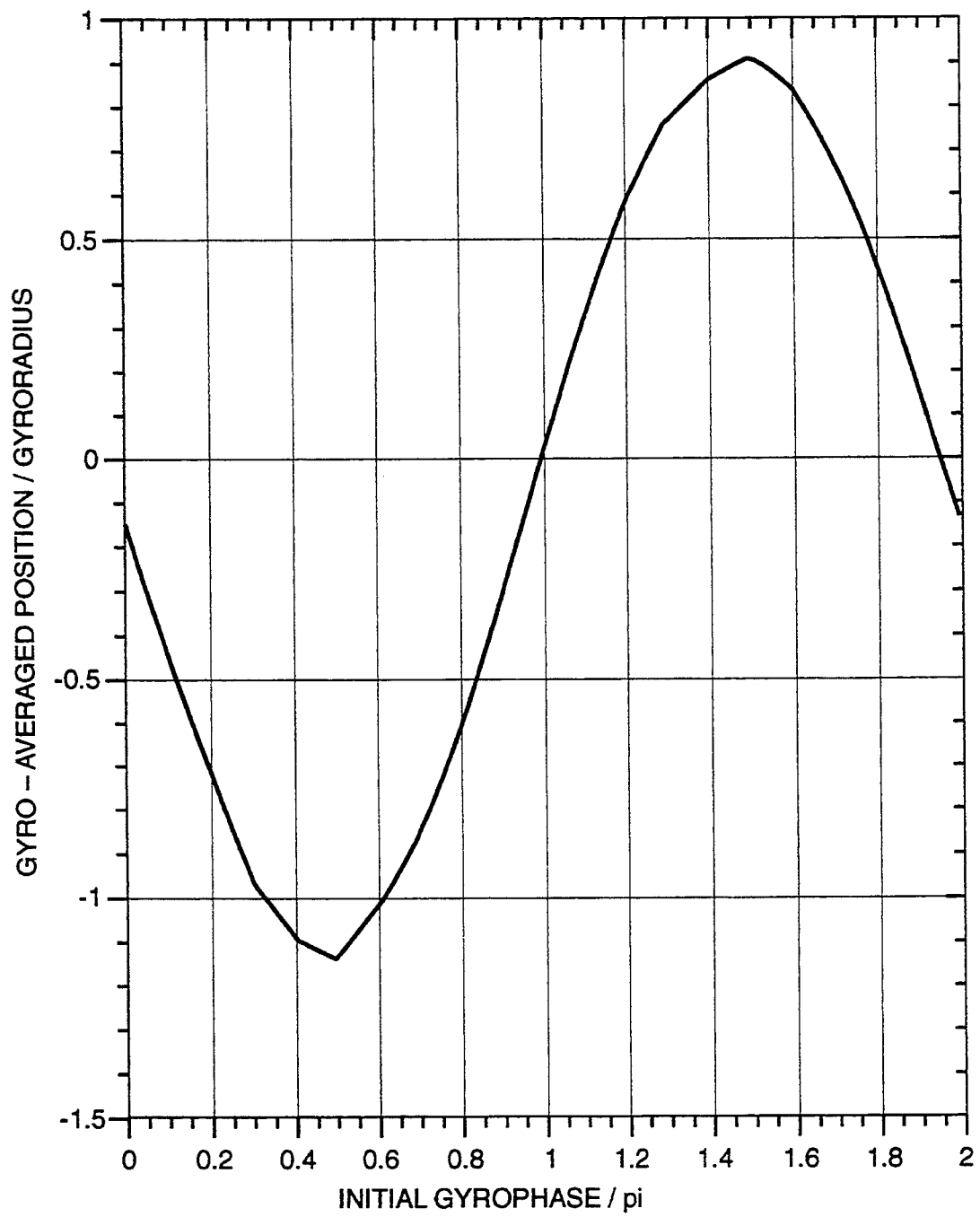
*FIG._9*

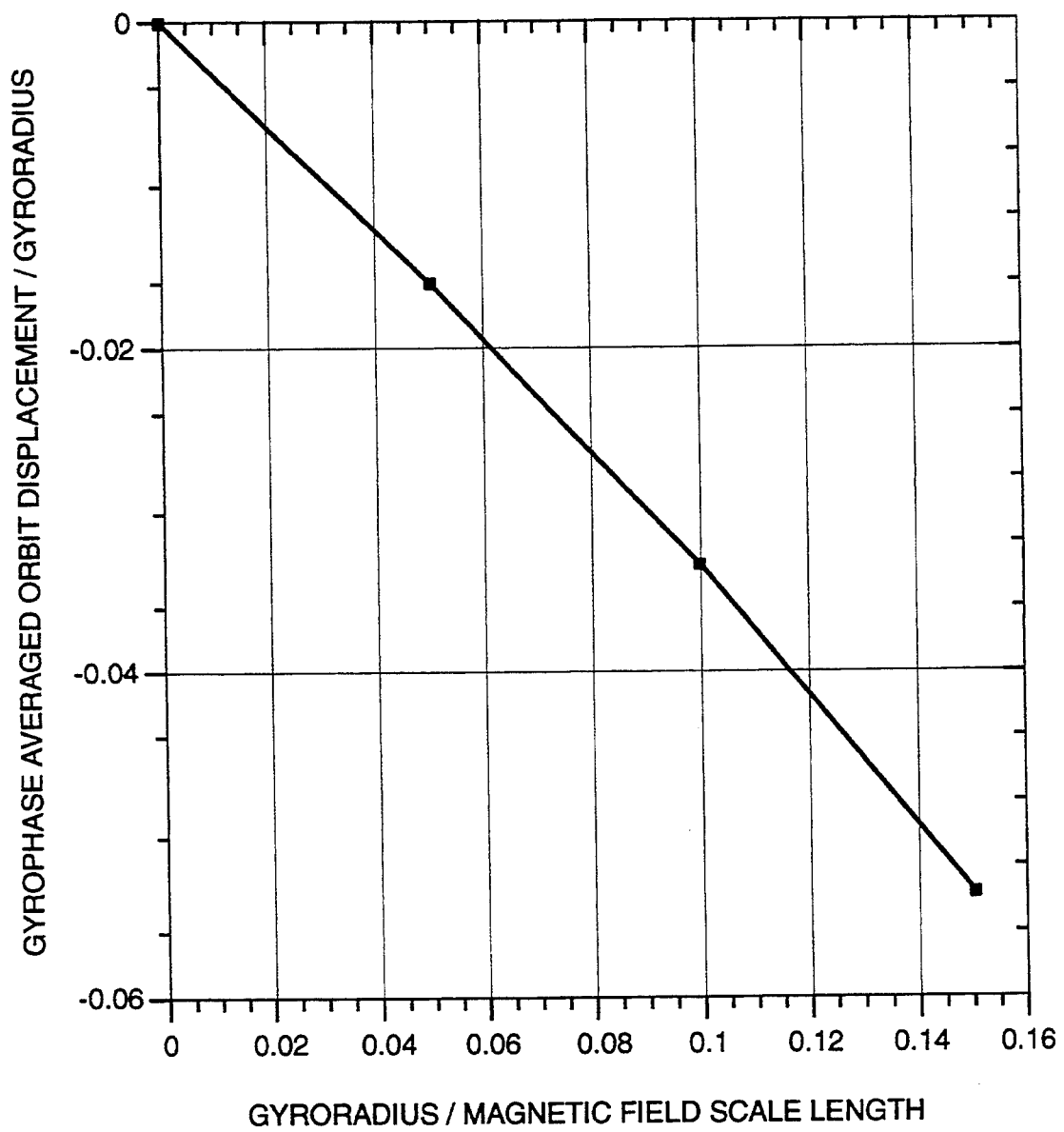
FIG._10

ELECTRON CYCLOTRON RESONANCE PLASMA SOURCE AND METHOD OF OPERATION

This is a continuation-in-part of U.S. Ser. No. 07/875,750, filed Apr. 29, 1992, now U.S. Pat. No. 5,203,960 which, in turn was a continuation of U.S. Ser. No. 320,947, filed Mar. 9, 1989, now U.S. Pat. No. 5,133,826.

FIELD OF THE INVENTION

The present invention relates to a method and apparatus employing electron cyclotron resonance heating for producing a plasma stream and more particularly to a method and apparatus employing such a plasma source for use in applications such as a negative ion source or the treatment of specimens such as VLSI wafers by applications including chemical vapor deposition and etching carried out by means of the plasma stream.

BACKGROUND OF THE INVENTION

The present invention is based upon generation of cold plasma by electron cyclotron resonance heating in order to develop various desired characteristics within the plasma. Thus, the present invention and related prior art are based upon criteria where conditions governing steady-state values of plasma density and composition as well as the electron and ion temperatures are determined by microwave power and neutral gas pressure through the conditions for particle and power balances for each of three coupled species; namely electrons, ions and gas atoms.

Even in idealized point-model approximations of full transport models, inter-related values of the basic plasma parameters present for all such systems demonstrate key dependencies which indicate some of the fundamental obstacles which make it difficult in practice to achieve large volumes of quiescent, homogeneous, low-temperature plasma containing the desired concentration of reacting species which are obviously desirable or essential in a large variety of applications including negative ion sources for accelerators and more specifically, in plasma assisted semiconductor processing applications referred to in greater detail below.

Basic problems in forming suitable plasmas are also noted in the prior art references discussed below. In any event, the following discussion of the prior art and the following description of the present invention, partially based upon a comparison with the prior art, are intended to further demonstrate novelty in the method and apparatus of the present invention for overcoming problems or obstacles such as those generally referred to above and discussed in greater detail below.

In the semiconductor processing application referred to above, plasma sources employing electron cyclotron resonance (ECR) heating comprise an emerging or developing technology, for example in the deposition and etching of VLSI films. Such applications are typical of other processing technologies requiring the capability of achieving submicron feature dimensions, substantial processing rates and the capability of uniformly processing large specimens such as wafers. The general characteristics of these technologies are believed to be well understood by those skilled in the art and are accordingly not discussed in substantial detail herein.

As noted above, although the ECR plasma source of the present invention is contemplated for use in vapor deposition or etching applications, the general parameters of those applications are not of themselves a portion of the invention. Certain considerations in such applications are briefly summarized below in order to facilitate a more complete understanding of the invention.

In any event, ECR plasma sources such as those provided by the present invention and the prior art discussed below employ magnetic fields and microwave power to create chemically active plasmas, preferably at very low gas pressures. Low pressure operation is desirable in order to permit the formation of highly directional or anisotropic streams of low-temperature ions, radicals and other species of reactants which are uniform over substantial transverse dimensions larger than the sample being processed.

In an ECR plasma source designed for plasma-enhanced chemical vapor deposition or reactive ion etching of VLSI films, for example, a reactant gas is introduced into an evacuated chamber which is immersed in a steady magnetic field and exposed to electromagnetic radiation. The frequency of the radiation, $f_\mu$, is selected to resonate with the electron gyrofrequency in a region of the steady magnetic field called the resonant interaction region. The resonance condition relates the strength of the steady magnetic field in this region, $B_{res}$, through the condition that $f_\mu = eB_{res}/2\pi m$, where e and m are the magnitudes of the electric charge and mass of the electron, respectively.

Electrons in the resonant interaction region gain kinetic energy from the electromagnetic radiation, and if the radiation power and the gas pressure are suitably adjusted, the heated electrons may ionize the reactant gas molecules to create a plasma. The plasma ions and electrons flow out of the resonant interaction region and impinge on the VLSI film where the ions can be used for deposition of new materials or etching of existing films. If the plasma density is sufficiently high, the deposition or etch rates can be rapid, and if the ion and electron energies are sufficiently low, damage to the sample being processed can be prevented. For etching submicron-scale features, it is necessary for the ion trajectories to be highly directional. This is made possible by operating at sufficiently low gas pressures to ensure that the ion mean-free-path for scattering is longer than the distance to the specimens.

Additionally, if the temperature of the plasma ions is sufficiently low, and if there are no groups of energetic ions, the substrate can be biased electrically, relative to the plasma interior, to potentials of sufficient magnitude to insure highly anisotropic processing without exceeding a threshold ion energy above which excessive damage may occur.

In order to process specimens of commercial interest, it is further necessary that the stream of plasma from the ECR source be uniform over transverse dimensions larger than 15-20 cm. The present invention, as described below, addresses the need for large, uniform streams of low-temperature plasmas with high densities of ions and electrons in low-pressure neutral gas mixtures.

In the prior art, one class of ECR plasma sources is generally referred to as the "Sumitomo source". The Sumitomo source is illustrated for example by the plasma deposition apparatus of Matsuo, et al. U.S. Pat. No. 4,401,054 issued Aug. 30, 1983, and further discussed in S. Matsuo, M. Kiuchi and T. Ono, in *Proceedings of the Tenth Symposium on IISIAT* 1986, Tokyo, p.

471 and T. Ono, M. Oda, C. Takahashi and S. Matsuo, *J. Vac. Sci. Technol.* B4, 696 (1986).

In the apparatus of that patent, plasma flows toward the substrate or specimen along magnetic lines of force. As described below, it is very difficult to achieve a desired degree of spatial uniformity in the cold-plasma density. Furthermore, since electrons heated at the resonant interaction region where the magnetic intensity satisfies the aforementioned resonance condition) flow directly toward the specimen along these magnetic lines of force, it is necessary to limit applied microwave power in order to avoid the creation of unstable bursts of energetic electrons and associated groups of energetic ions which might damage the specimen. The physical processes responsible for generation of these unstable bursts of electrons and resultant energetic ions are discussed in the papers by Quon and Dandl; Guest, Fetzer and Dandl; and Dandl and Guest, which are incorporated in the experimental section below.

Related prior art references include U.S. Pat. No. 4,492,620 issued Jan. 8, 1985 to Matsuo, et al. and entitled "Plasma Deposition Method and Apparatus" and U.S. Pat. No. 4,564,997 issued Jan. 21, 1986 to Matsuo, et al. and entitled "Semiconductor Device and Manufacturing Process Thereof".

The above three patents issued under assignment to Nippon Telegraph & Telephone Public Corporation. Still other related references issued common assignment include U.S. Pat. No. 4,450,031 issued May 22, 1984 to Ono, et al. and entitled "Ion Shower Apparatus"; U.S. Pat. No. 4,503,807 issued Mar. 12, 1985 to Nakayama, et al. and entitled "Chemical Vapor Deposition Apparatus"; and U.S. Pat. No. 4,566,940 issued Jan. 28, 1986 to Itsumi, et al. and entitled "Manufacturing Process for Semiconductor Integrated Circuits".

Another design of a plasma source (of a very different fundamental nature) originated in France and was disclosed in U.S. Pat. No. 4,534,842 issued Aug. 13, 1985 to Arnal, et al. and entitled "Process and Device for Producing a Homogeneous Large-Volume Plasma of High Density and of Low Electronic Temperature". In the process and device of that patent, plasma was accumulated in a large volume free of magnetic fields to enhance spatial uniformity; however, the ECR heating region was localized to a small volume limiting the efficiency of plasma generation and thus the ratio of ion density to neutral gas density. Furthermore, energetic charged particles were not prevented from striking the chamber wall and thereby producing excessive densities of impurities.

Related references disclosing various concepts for ion sources include U.S. Pat. No. 3,571,734 issued Mar. 23, 1971; U.S. Pat. No. 3,774,001 issued Nov. 20, 1973; U.S. Pat. No. 3,790,787 issued Feb. 5, 1974; U.S. Pat. No. 4,417,178 issued Nov. 22, 1983; and U.S. Pat. No. 4,638,216 issued Jan. 20, 1987.

Still another set of references disclosed various designs for ion sources and included U.S. Pat. No. 3,500,077 issued Mar. 10, 1970; U.S. Pat. No. 3,582,849 issued Jun. 1, 1971; U.S. Pat. No. 3,660,715 issued May 2, 1972; U.S. Pat. No. 3,663,360 issued May 16, 1972; and U.S. Pat. No. 3,742,219 issued Jun. 26, 1973.

All of the above references as well as references cited therein are incorporated herein in order to assure a more complete understanding of the background for ECR plasma sources and applications therefor.

Accordingly, as was also noted above, there has been found to remain a need for ECR plasma sources useful in a variety of applications and capable of producing large, uniform streams of quiescent, low-temperature plasmas with high densities of ions and electrons, especially in low-pressure neutral-gas mixtures in order to assure unidirectionality or anisotropy of the plasma flow or flux, as well as the desired composition of reactant species.

Furthermore, different plasma-enhanced processing applications require that the plasma be enclosed in chambers whose walls are made of particular materials, such as fused quartz, stainless steel, nickel, aluminum, etc., depending on the specific requirements of the process for which the plasma is to be employed.

SUMMARY OF THE INVENTION

It is therefore an object of the present invention to provide a method and apparatus for producing plasma by means of electron cyclotron resonant heating while overcoming one or more problems of the type generally referred to above and also achieving one or more related advantages.

It is a further object of the invention to provide a method and apparatus for producing plasma by means of electron cyclotron resonance heating either for use in applications such as chemical vapor deposition and etching or other applications such as a negative ion source wherein a plasma source chamber is formed as a symmetrical cylinder having a longitudinal axis with an outlet at one axial end of the chamber and means for introducing a gaseous medium into the chamber. Separate embodiments of the invention are described below which permit large volumes of uniform, cold plasma to be generated within a chamber formed of fused quartz, or, alternatively, within a chamber having all metal walls. Magnetic field forming magnets are arranged circumferentially about the chamber for forming continuous, axisymmetric field force lines annularly extending about the chamber and for producing a resonant interaction envelope within the chamber. Within this combination, microwave power is injected into the plasma forming chamber along injection axes extending perpendicularly to the longitudinal chamber axis and preferably in radial relation thereto so that plasma electrons made energetic by interaction with the power source are not permitted line-of-sight communication along magnetic lines of flow to the outlet.

The microwave power is injected using a novel microwave applicator which can be adapted to function in each of the different chambers discussed here (fused quartz or all-metal), provided that the magnetic field configuration is also modified properly, as well be described below. Indeed, the microwave applicator disclosed herein can be used to form large rectilinear arrays for treating very large surface areas, as is described below.

More preferably, the microwave power is injected into the chamber in manners selected so that resulting energetic electrons are caused either to experience multiple collisions with the magnetic field force lines or to precess in annular magnetic mirror regions formed by the circumferentially arranged magnets. The precessional motion of charged particles in magnetic mirror configurations was discussed at length in books such as *Plasmas and Controlled Fusion* by David J. Rose and Melville Clark, Jr., John Wiley & Sons, N.Y., 1961, particularly pp. 215-221. This configuration greatly enhances the likelihood of collision of the energetic electrons with gas atoms in order to result in a substantial increase in plasma density even with low gas pressure in the plasma forming chamber.

Gas pressure within the plasma forming chamber is preferably maintained at a low level, for example, below about $10^{-5}$ to above about $10^{-4}$ Torr, in order to assure unidirectionality or anisotropy in the plasma flow and desired concentrations of reactant species as discussed in greater detail below.

Within a plasma chamber formed as described above, a magnetic field free region is preferably formed between the plasma forming chamber and the outlet in order to permit the plasma to develop uniformity over substantial transverse dimensions.

With the plasma source being employed for chemical vapor deposition or etching, specimens to be coated or etched are arranged in communication with the outlet so that the substantial transverse dimensions containing plasma with high uniformity are larger than the specimens in order to assure uniform treatment across the entire surface of the specimen.

Thus, the method and apparatus of the present invention have been found to produce a plasma stream having a substantial plasma density resulting in an ion flux or current density much greater than has been available in the prior art. At the same time, uniformity of plasma distribution for the plasma stream is achieved within the magnetic field free region referred to above. Even further, with low gas pressure being maintained in the plasma source chamber, unidirectional or anisotropic flow of suitable non-equilibrium plasma is also maintained in the plasma stream in order to further facilitate applications for achieving submicron feature dimensions as discussed above and for other applications as desired.

Within the above combination, a microwave power source preferably includes one or more pairs of annular sectors of slotted wave guide microwave applicators circumferentially arranged about the chamber for producing more symmetrical and uniform microwave power levels in the resonant interaction region. Furthermore, the microwave power source is located in a region of magnetic intensity that is greater than in the resonant interaction region (64 below) to permit the formation of high plasma density wherein the electron plasma frequency greatly exceeds the electron gyrofrequency, a condition generally referred to as "overdense operation", as discussed in Quon and Dandl.

It is accordingly a further object of the invention to provide a microwave power source including an axisymmetric microwave plasma coupler applicator including one or more pairs of annular sectors in order to enhance the method and apparatus of the invention.

The applicator may be circumferentially arranged about the chamber as noted above to preferably place it out of line-of-sight communication with a specimen in order to prevent damage to the specimen by energetic particles from the applicator. However, it is also an object of the invention to provide the applicator in a rectilinear array together with the magnetic field forming apparatus for certain applications discussed in greater detail below, particularly applications where the specimen is not as susceptible to damage from energetic particles.

Additional features are also preferably employed in the method and apparatus of the invention to further enhance various characteristics of the plasma stream produced at the outlet of the chamber.

For example, the microwave power source is preferably arranged in association with the circumferential magnetic field forming magnet means so that a fraction of the resulting energetic electrons is caused to precess in annular magnetic mirror regions extending continuously about the symmetrical chamber. In this manner, energy in the energetic electrons resulting from interaction with the microwave power source is efficiently convened to plasma by interaction of the precessing electrons with gas atoms in order to maximize plasma density even with the preferred relatively low gas pressures in the chamber.

Annular impurity trapping recesses are also preferably formed adjacent the circumferentially arranged magnet means for receiving energetic electrons leaking from the annular magnetic mirror regions. Additional means are associated with the impurity trapping recesses for preventing the energetic electrons from returning to the chamber, for example, by means of cryogenic surfaces in the recesses either for the reduction of sputtering of impurities from the recess of walls or for causing the energetic electrons to recombine with ions and adhere to the cryogenic surfaces. Resulting gas would also be removed from the impurity trapping regions while preventing it from returning to the chamber, for example, by means of vacuum pumps in communication with the impurity trapping recess or recesses.

Preferably in association with the impurity trapping recesses, the circumferential magnet means also preferably include means tending to close the magnetic field force lines tightly thereabout both for purposes of minimizing leakage of energetic electrons from the annular magnetic mirror regions and also to minimize random field force lines undesirably extending into certain portions of the chamber, particularly the magnetic field free region noted above.

The method and apparatus of the present invention are capable of producing a plasma stream with a current density greatly in excess of ten milliamperes per square centimeter (10 mA/cm$^2$) and, more specifically, a current density at least about one hundred milliamperes per square centimeter (100 mA/cm$^2$). By contrast, prior art plasma sources have only been capable of generating plasma streams with current densities of no more than ten milliamperes per square centimeter. For example, the Sumitomo source described in Matsuo, et al. U.S. Pat. No. 4,401,054 noted above was described as being capable of generating or producing a plasma stream with about nine milliamperes per square centimeter. That value is believed to be representative of prior art.

Furthermore, in prior art references emphasizing uniformity of plasma density, considerably lower ion fluxes were encountered. The present invention contemplates generating a plasma stream with a high ion flux or current density but also a plasma stream which is, at the same time, highly uniform in plasma density, because of the magnetic field free region referred to above, and unidirectional or anisotropic even when low gas pressures are maintained within the chamber.

The ability to produce high current density even at low gas pressures is made possible in part because of efficiency in the present invention resulting from precessing of energetic electrons about the symmetrical, cylindrical chamber in order to enhance conversion of the microwave power into cold plasma through interaction of the precessing electrons with gas atoms. It results in part from efficient transport of plasma into the field-free region, as discussed in greater detail below.

Additional objects and advantages of the invention are made apparent in the following description having reference to the accompanying drawings.

BRIEF DESCRIPTION OF THE DRAWINGS

FIG. 1 is an axially sectioned generally schematic representation of a plasma forming chamber constructed in accordance with the present invention and particularly adapted for use in chemical vapor deposition or etching of specimens such as VLSI wafers, sectioning lines being omitted for clarity.

FIG. 2 illustrates an alternate embodiment of the invention including a fused quartz chamber.

FIG. 3 illustrates a separate embodiment including an all-metal chamber.

FIG. 4A is a sectioned view in elevation illustrating a large rectilinear array applicator.

FIG. 4B is a fragmentary plan view of the rectilinear array applicator.

FIG. 5 is a similar view of another embodiment of the plasma forming apparatus of the present invention adapted for use in other applications such as a negative ion source.

FIG. 6 is a fragmentary representation of a novel applicator and coupler for the invention, the applicator being formed as paired elements.

FIG. 7 is a graphical representation illustrating the effects of arbitrary values of the initial gyrophase angle.

FIG. 8 illustrates a numerical evaluation of the gyrophase average from FIG. 7.

FIG. 9 illustrates the gyro-period averaged displacement as a function of the initial gyrophase angle.

FIG. 10 illustrates the average over initial gyrophase for a range of values of $p_0/L$.

DESCRIPTION OF THE PREFERRED EMBODIMENT

The following descriptive material is divided into two sections including (a) an initial detailed description of the plasma forming apparatus and method of operation contemplated by the present invention. Thereafter, a theoretical section (b) is provided to further enhance understanding of the invention. That section incorporates a number of published references setting forth the theory of the present invention and an additional section discussing "Cross-Field Plasma Flow in Non-Uniform Magnetic Fields".

The description emphasizes various advantages of the invention. In particular, the theoretical section and the references cited therein emphasize advantages of the present invention relative to a representative prior art plasma source, namely the Sumitomo source referred to above.

Referring now to the drawings and particularly to FIG. 1, a novel electron cyclotron resonance plasma source constructed according to the present invention is indicated at 10 and is contemplated for producing or generating a large diameter or cross-sectional stream of uniform, low-temperature plasma, even when low background gas pressures are maintained in the plasma source or chamber.

The plasma source 10 comprises a chamber or enclosure 12 which is preferably a cylinder symmetrical about its longitudinal axis 14 for purposes described in greater detail below.

Neutral reactant gas mixtures are introduced into the chamber 12 in a generally conventional manner from a source 16.

The chamber 12 is also provided with high-speed vacuum pumps schematically indicated at 18 and adapted for maintaining low background gas pressure within the chamber in a preferred operating range of about $10^{-5}$–$10^{-4}$ Torr. The purpose for the preferred low pressure background gas is also discussed in greater detail below.

An alternative embodiment that employs a fused quartz chamber is shown in FIG. 2. A separate embodiment especially suited for use in an all-metal chamber is shown in FIG. 3. A large rectilinear array applicator is shown in FIG. 4. The generic source shown in FIG. 1 is first described below.

Referring again to FIG. 1, symmetric magnetic field force lines are formed within the chamber 12 by a plurality of cylindrical arrays of permanent magnets generally indicated at 20. In particular, two ring-shaped cylindrical magnet assemblies 22 and 24 are arranged about the circumference of a plasma forming portion 26 for developing magnetic field force lines which are configured as cylindrical lobes.

Three lobed magnetic field force lines are indicated at 28, 30 and 32 for the cylindrical magnetic assembly 22. Similarly lobed magnetic field force lines 34, 36 and 38 are illustrated for the other cylindrical magnetic assembly 24.

It is important to note that the magnet assemblies 22 and 24 are cylindrical and generally symmetrical about the circumference of the chamber 12 so that each adjacent pair of lobed magnetic field force lines, principally those indicated at 28, 30 and 34, 36 form annular magnetic mirror regions indicated respectively at 40 and 42. Those regions are shown with cross hatching in order to better emphasize the locations of the magnetic mirror regions 40 and 42.

A microwave power source 44 is arranged between the magnet arrays 22 and 24 adjacent the plasma forming portion 26 of the chamber. Preferably, the microwave power source 44 is provided with one or more pairs of annular sectors of slotted wave guide microwave applicators 46 through which the microwave power is introduced into the plasma forming portion 26 of the chamber. In any event, the microwave power is introduced along multiple injection axes indicated by the arrows 48 which extend perpendicular to the chamber axis 14.

The slotted wave guide microwave applicators 46 novelly causes the microwave power to be uniformly introduced about the entire periphery of the chamber. In addition, because of the symmetrical construction of the chamber, the injection axes 48 are all radially arranged relative to the longitudinal axis 14. Furthermore, the magnetic intensity decreases from a local maximum at the location of the slotted wave guide to the resonant value so as to permit over-dense operation as described above.

With regard to the axisymmetric microwave plasma coupler applicators 46, they are formed as one or more pairs of elements of the type described before. That is, each element is a slotted-waveguide antenna formed in the shape of an arc so that the complete applicator comprises a full circle that circumferentially encloses the plasma. Separating the applicator into pairs of elements permits the microwave power to be supplied by a hybrid coupler 47, which provides a stable match to the variable impedance of the plasma without the necessity of the usual tuning stubs (not shown). It also reduces the microwave power density passing through each of the windows required for introducing microwave power into the highly evacuated interior of the microwave source. The hybrid coupler is well known to those skilled in the art and is novel within the invention only in combination with the paired applicators.

Note: The basic theory of slotted-waveguide antennas is treated in standard references, such as "Antenna Engineering Handbook", Henry Jasik, editor, Chapter 9, entitled "Slot-Antenna Arrays", by M. J. Ehrlich, McGraw-Hill (1961), and many other similar texts. The engineering design requires specialized calculations which are known to those who are skilled in the art.

With regard to the magnetic-field configuration, it is important to recognize several distinct requirements that must be satisfied simultaneously, as the invention does in a unique way.

The first requirement for magnetic-field configuration is that it must permit microwave illumination of the resonant interaction region with the applicator positioned for high-field launch of plasma waves. If the radiating surface of the applicator is at a radial position given by $r_{applicator}$, and the resonant interaction region is at a radial position given by $r_{resonance}$, it is required that the magnetic field strength satisfy the equation $$B(r_{resonance}) = 2\pi f_\mu m/e = B_{resonance}$$

$$B(r_{applicator}) > 1.5 \, B_{resonance}$$

and $$r_{applicator} - r_{resonance} \sim c/f_\mu,$$

where $f_\mu$ is the frequency of the microwave power, m and e are the mass and electric charge of the electron, and c is the speed of light in vacuum. Additionally, the magnetic field strength in the evacuated portions of the waveguide must exceed $B_{resonance}$ in order to prevent RF breakdown.

Since it is required that the plasma accumulate and thermalize in a region of vanishingly small magnetic intensity, the magnetic field strength must diminish sharply with decreasing radius. The magnetic field lines adjacent to the applicator have the additional function of confining energetic electrons in magnetic-mirror traps. This magnetic-mirror confinement inhibits the spatial transport of the energetic electrons to minimize the plasma-wall interaction and thereby reduce the rate of wall erosion and impurity generation, while increasing the efficiency with which gas is ionized to form the useful plasma. Specifically, it is required that these magnetic lines of force have the (axisymmetric) lobe-shaped configuration as illustrated. Regions where the field lines converge are regions of high magnetic field strength; i.e., magnetic mirrors.

Note that the lobe-shaped magnetic field lines prevent some of the electrons from moving directly from the resonant interaction region to the sample being processed. Instead, the geometrical configuration of the magnetic field causes plasma to flow radially inward into the region of low magnetic field strength.

Before describing interaction of the microwave power source 44 and the cylindrical magnet assemblies 22 and 24 in greater detail, it is noted that an outlet 50 is formed at one axial end of the chamber 12. The other axial end of the chamber 12 is closed by a wall 52 and an additional permanent magnet array 54 which assists in developing the magnetic field within the plasma forming portion 26 of the chamber with the desired central field-free region. In addition, the magnet array 54 conventionally forms magnetic insulation for the end wall 52. A similar insulating function is also performed by the cylindrical magnet array 20 and particularly the cylindrical magnet assemblies 22 and 24.

With the microwave power source 44 arranged as described, it is important to note that energetic electrons formed by interaction of the microwave power with background plasma existing in the chamber are prevented from direct line-of-sight communication with the specimens 56. Rather, the energetic electrons formed by the microwave power may be considered in two classes first. A first class of the energetic electrons tend to enter the central region of the plasma forming chamber portion 26 where they impinge or collide with field force lines such as those indicated at 28-30 as they are transported radially into the central field-free region. Energetic electrons in this first class thus tend to bounce back and forth laterally within the plasma forming chamber portion 26 until they eventually interact or collide with neutral gas atoms and degrade in energy to assist in increasing density of the cold plasma.

The second class of energetic electrons is dependent upon the arrangement of the microwave power source 44 adjacent and preferably intermediate the two cylindrical magnet assemblies 22 and 24. This second class of energetic electrons is captured within magnetic mirror regions such as those indicated at 40 and 42.

Because of the annular or continuous nature of the magnetic mirror regions, energetic electrons in the so-called second class continuously travel about the annular path formed by the magnetic mirror regions in a process commonly referred to as "precessing". In any event, with these energetic electrons precessing about the annular or continuous magnetic mirror regions, they tend to remain trapped therein until they also collide with neutral gas atoms whereupon they also degrade to further assist in increasing the density of the cold plasma within the plasma forming chamber portion 26. At the same time, some of these electrons flow into the central region through the mechanisms discussed in the final theoretical section.

In any event, the symmetrical configuration of the cylindrical chamber 12 together with the interacting arrangement of the cylindrical magnet assemblies 22, 24 and the microwave power source 44 produces great efficiency in converting the microwave power into cold plasma while also preventing line-of-sight communication of the energetic electrons with the specimens 56 as noted above.

With the plasma source 10 of FIG. 1 being preferably adapted for use in chemical vapor deposition or etching, for example, a wafer 56 is arranged upon a holder 58 in communication with the outlet 50. At the same time, a magnetic field free region 60 is formed in the chamber 12 intermediate the plasma forming chamber portion 26 and the outlet 50. Insulating magnets 62 are also arranged about the circumference of the magnetic field free region 60 in order to prevent plasma in the region 60 from colliding with adjacent wall portions of the chamber as well as to reduce the interior magnetic field strength to sufficiently low values.

In accordance with conventional electron cyclotron resonance heating practice, the microwave power source 44 and the magnets are adapted for producing a resonant interaction region generally indicated as a continuous surface at 64. As illustrated in FIG. 1, the resonant heating region 64 extends substantially into the plasma producing chamber portion 26 while being absent from the magnetic field free region. It is of course to be understood that energy in energetic electrons passing through the resonant region 64 is increased.

Generally, the first class of energetic electrons referred to above tends to pass through the region 64 only once and thereafter to remain in a central portion of the plasma forming chamber 26 until interacting with gas atoms as described above.

The second class of energetic electrons which precess in the magnetic mirror regions have their energy levels further increases since they are capable of passing through the resonant region 64 numerous times while precessing about the circumference of the chamber. For that reason, the magnets are designed so that the resonant heating envelope 64 preferably intersects the magnetic mirror regions 40 and 42 in order to achieve elevated energy levels for the energetic electrons therein.

Since some energetic electrons may tend to "leak" out of the magnetic mirror regions 40 and 42 toward the cylindrical walls of the chamber 12, impurity trapping recesses 66 and 68 are annularly formed adjacent the cylindrical magnet assemblies 22 and 24. Thus, any energetic electrons and accompanying ions tending to leak out of the magnetic mirror regions 40 and 42 enter into the recesses 66 and 68. Here again, energetic electrons in the recess 66 are prevented from line-of-sight communication with the outlet 50 by means of an annular deflector 70 generally arranged between the recess 66 and the magnetic field free region 60. Wall surfaces in the recesses 66 and 68 are preferably formed from a suitable dielectric material in order to minimize sputtering of wall material.

The invention also contemplates providing means either in or in communication with the recesses 66 and 68 to further prevent the energetic electrons or impurities within the recesses 66 and 68 from entering the plasma forming chamber portion 26. For example, cryogenic surfaces 72 may be formed in the recesses for trapping the energetic electrons and impurities for that region. Alternatively, high vacuum sources (not shown) could be arranged in communication with the recesses 66 and 68 for the same purpose.

In addition to trapping energetic electrons in the recesses 66 and 68, the cylindrical magnet assemblies 22 and 24 are also preferably configured for closing their magnetic field force lines more tightly about the magnet assemblies in order to also minimize such leakage. For that purpose, each of the cylindrical magnet assemblies 22 and 24 is formed with a principle cylindrical magnet 74 or 76 generally facing the plasma forming chamber portion 26. Additional paired magnets 78, 80 and 82, 84 are arranged behind the principle magnets with their polar axes diagonally oriented as illustrated by the arrows so that the magnetic field force lines are closely drawn about the magnet assemblies as illustrated in FIG. 1. Alternative combinations of magnetic materials can be devised to yield magnetic configurations that satisfy all the requirements identified herein. The particular choice shown in FIG. 1 illustrates only one of several practical embodiments. Others are illustrated below.

At the same time, the cylindrical magnet assemblies 22 and 24 also prevent the magnetic field force lines from extending into the magnetic field free region 60 so that it is better able to accomplish its function.

It is generally believed that the mode of operation for the plasma source 10 will be apparent to those skilled in the art from the preceding description. However, the method of operation is described briefly below in order to assure a complete understanding of the invention.

In operation, referring again to FIG. 1, energetic electrons are initially formed by interaction of microwave power from the source 44 with background plasma initially present in the plasma forming portion 26 of the chamber. Two classes of energetic electrons are formed as described above, both of which are prevented from direct line-of-sight communication with the outlet 50.

Because of the design of the cylindrical chamber 12, the magnets and the microwave power source, high efficiency is accomplished in conversion of energetic electrons to increase the density of the cold plasma. Furthermore, with low pressure being maintained in the chamber, the plasma flow to the substrate is also unidirectional or anisotropic as also discussed above. As cold plasma flows or streams from the plasma forming chamber portion 26 toward the outlet 50, it passes into the magnetic field free region 60. In that region, because of the substantial absence of magnetic field force lines, the cold plasma expands freely in the transverse direction and becomes very uniform in density as it approaches the outlet 50. Thus, as plasma streams through the magnetic field free region 60 toward the outlet 50, it is characterized not only by high current density but also by uniformity of plasma density in order to greatly enhance the uniformity of chemical vapor deposition or etching on the specimen 56.

It is of course to be understood that in carrying out these processes, additional active gases are introduced either initially with the inert gas or subsequently, possibly in the magnetic field free region so that the plasma is capable of performing its normal functions in those applications. Low-pressure operation permits desired concentrations of reactive plasma species to reach the specimen.

It is also to be understood that a method and apparatus for generating or producing plasma by electron cyclotron resonant hearing in accordance with the present invention may be useful in other applications. For example, the plasma source of the present invention may also be used as a negative ion source with substantially all components of the plasma source being similar to those described herein. Other related applications are also of course possible for the method and apparatus of the invention.

FIG. 2 indicates schematically how the microwave applicator 46' can be used in conjunction with a fused quartz liner 49.

The applicator 46' can be operated at atmospheric pressure, since fused quartz is an entirely satisfactory material for forming a microwave window needed to separate the partially evacuated plasma region from atmospheric pressure. For the microwave power levels of interest here, breakdown will not occur inside the applicator if it is operated at atmospheric pressure, regardless of the value of the magnetic field strength within the applicator. Thus, the requirements that the magnetic field configuration must satisfy can be substantially relaxed.

In particular, the trough between the main rings of permanent magnets in which the applicator 46' is located can be open around the entire circumference. The magnetic configuration can thereby approximate more nearly the desired axisymmetry; since the symmetry need not be broken by localized penetrations to accommodate the microwave power coupling structures. This enhanced degree of azimuthal uniformity is expected to substantially increase the plasma uniformity by avoiding residual non-axisymmetric magnetic field structures that tend to impress a corresponding structure on the plasma itself.

The magnetic field is very efficiently generated by using rings of permanent magnets oriented generally as shown in FIG. 2, in conjunction with rings of mild steel that are indicated there. Structures of the general type shown in the figure meet the several requirements that have been specified earlier.

It is necessary to modify the detailed design features of the slots machined into the face of the slotted-waveguide applicator to account for the proximity and thickness of the quartz chamber walls; but this readily can be done by those skilled in the art of microwave antennas.

Note in FIG. 2 that mild-steel bands 51 are movably inserted at the position of the permanent magnet pole faces to permit final adjustments to the magnetic field configuration after the permanent magnets have been installed, thereby relaxing what would otherwise be excessively stringent magnetic fabrication tolerances. These mild-steel bands are particularly beneficial in that they can be moved small distances along the axis of the cylindrical array to adjust the value of the magnetic field strength on the axis of the chamber to the exact value required to allow the plasma to expand more freely in the radial direction, i.e., in the direction transverse to the axis of the chamber.

FIG. 3 indicates schematically how the applicator 46" is adapted to form plasmas in an all-metallic chamber.

Since the applicator must be operated within the partially evacuated plasma chamber, the evacuated portion of the applicator is isolated from atmospheric pressure by a suitable internal microwave window (not shown).

The magnetic intensity everywhere inside the evacuated portion of the applicator must exceed the resonance value, $B_{res}$, in order to prevent microwave breakdown inside the applicator. Here $B_{res}=2\pi(m/e)f_\mu$, where these symbols have been defined previously.

With the applicator formed from narrow-height waveguide being slotted on its broad face, it can be located directly in front of the pole face of a ring of permanent magnets, as shown in FIG. 3. In this way, it is possible to meet the requirements for prevention of breakdown in a particularly efficient way and thereby minimize the weight and cost of the permanent magnet system.

In this configuration, the microwave window is placed at the end of the applicator adjacent to the waveguide coupler that connects the applicator to the microwave power generator, so that all of the evacuated portions of the applicator are in a magnetic field that exceeds the electron cyclotron resonance value.

Note that, as shown in the FIG. 3, the narrow-height waveguide coupler can be brought out in the axial direction without penetrating any of the permanent magnet rings, thereby preserving the symmetry of the magnetic field.

FIGS. 4A and 4B illustrate how the microwave applicator or applicators 101 are adapted for use in a large-area rectilinear array 102 for treating specimens 103 with very large surface areas. The figures display a cross-section through rows 104 of permanent magnets 105 magnetized in the directions shown by arrows and mounted on a mild steel shell 106. The applicators are formed from straight sections of waveguide slotted on the broad face, as was also the case in the all-metal system. The embodiment shown schematically in FIGS. 4A and 4B is suitable for treating large, flat specimens; but the rectilinear array of slotted-waveguide applicators can readily be shaped in cross-section to conform to large curved surfaces. Such a conformal array of applicators could be used to ensure uniform treatment of very large curved surfaces.

Note, however, that the sample to be treated is directly opposite the resonant interaction region, and will thus be accessible to energetic electrons generated by the electron cyclotron heating process. Although the generation of bursts of energetic electrons is ameliorated by the distribution of the heating power over a large area, it is intended that this approach be utilized for applications that are not highly sensitive to damage, such as deposition of diamond films, ion implantation or other types of surface modification, etc.

Accordingly multiple embodiments and methods of operation have been described above for the plasma source of the present invention. Novelty in features of the invention as described above are further emphasized by the following theoretical discussion which is set forth for purposes of explanation and not to limit the invention.

THEORETICAL BACKGROUND CONSIDERATIONS

The theoretical basis for the present invention is set forth in large part by various references, three particular references being described and incorporated by reference for that purpose.

The first reference is a paper by B. H. Quon and R. A. Dandl entitled "Preferential electron-cyclotron heating of hot electrons and formation of overdense plasmas", *Phys. Fluids* B 1 (10), October 1989.

The second reference is a paper by G. E. Guest, M. E. Fetzer and R. A. Dandl entitled "Whistler-wave electron cyclotron heating in uniform and nonuniform magnetic fields", *Phys. Fluids* B 2 (6), June 1990.

The third reference is a paper by R. A. Dandl and G. E. Guest entitled "On the low-pressure mode transition in electron cyclotron heated plasmas", *J. Vac. Sci. Technol.* A 9 (6), November/December 1991.

The first paper relates to experimental work leading to the theoretical interpretation of the present invention. In addition, the experimental work described in that paper supports the disclosed embodiments of the invention. The second and third references relate to theoretical interpretation of the invention as developed following the experimental work set forth in the first paper.

The theoretical interpretation of the present invention is clearly set forth by these three papers and they are accordingly incorporated herein as though set forth in their entirety to ensure a complete understanding of the invention.

Following the theoretical interpretation of the above three papers, a further theoretical picture of plasma transport mechanism responsible for the transport of electrons across the magnetic field and into the low-field region in the center of the chamber is set forth below.

CROSS-FIELD PLASMA FLOW IN NON-UNIFORM MAGNETIC FIELDS

1. INTRODUCTION

The classical collisional transport of plasma across magnetic fields has been investigated intensively, both experimentally and theoretically, in support of the international effort to develop controlled thermonuclear power. The so-called neoclassical theory has been used for some twenty-five years or more as the basis for interpretation of experiments in the magnetic confinement of fusion power related plasmas in devices such as the tokamaks, stellarators, ELMO Bumpy Torus, and other toroidal magnetic configurations. Nonetheless, in considering issues of plasma transport in various non-fusion plasmas one encounters parameter regimes in which transport mechanisms that are not important in fusion plasmas, and consequently not as intensively studied, can contribute significantly to determining the equilibrium properties of the plasma. In what follows we discuss a particular example of such a transport mechanism that may have only limited relevance to fusion-related magnetically-confined plasmas, but which can play a major role in the performance of plasma sources under development for plasma processing applications and other non-fusion purposes.

The mechanism to be described here is most simply visualized in axisymmetric magnetic configurations where radial gradients in the steady magnetic field strength cause charged particles to precess in the azimuthal direction. As will be shown in the following, in the presence of collisions this precessional drift of charged particles leads to their radial flow in the direction of decreasing magnetic intensity. The magnitude of the radial flow velocity is proportional to $\rho^2 \nu/L$, where $\rho$ is the local gyroradius of the precessing charged particle, $\nu$ is the collision frequency, and L is the characteristic scale length of the inhomogeneous magnetic field: $L^{-1} = |\nabla B|/B$. This flow therefore becomes large in magnetic fields having strong gradients but relatively small local magnitudes. Just such situations frequently obtain in plasma sources that use surface magnetic fields formed by multipole or multi-dipole arrays of magnets to reduce plasma losses to chamber walls. Transport models of plasmas confined in configurations of this type, the so-called "magnetic buckets", may need to include the present mechanism to account for plasma flow into the central region of very low magnetic field strength.

In the following, a microscopic description of the orbits of charged particles in idealized inhomogeneous magnetic fields is employed to demonstrate the origin and basic characteristics of the radial flow resulting from the gradient in the magnetic intensity. The magnetohydrodynamic model is subsequently employed to provide an alternative picture of this transport mechanism.

2. CHARGED-PARTICLE ORBITS IN NON-UNIFORM MAGNETOSTATIC FIELDS

The origin of gradient-driven flow is first demonstrated using an idealized magnetic configuration such that $B = B(y)e_z$. As is well known, the guiding centers of charged particles will experience a drift in this magnetic field that is given by $$v_g = (mv_\perp^2/2q)[(B \times \nabla B)/B^3] = -mv_\perp^2/(2qBL)\hat{e}_x.$$

where $v_\perp$ is the component of the particle's velocity perpendicular to B, $L^{-1} = B^{-1}dB/dy$, and m and q are the mass and charge of the particle, respectively. In addition to this familiar guiding-center drift, the particle orbits are displaced in the direction opposite to the magnetic field gradient, as can readily be seen from the following heuristic argument.

Consider the extreme case in which the magnetic field has an abrupt change of magnitude at some boundary, specified by $y = y_{bd}$:

$$B(y) = \begin{cases} B_1, & y > y_{bd} \\ B_2, & y < y_{bd} \end{cases}$$

with constant values $B_1 > B_2$ in the two regions. For definiteness we will describe the orbits of electrons, so that $q = -e$ and $m = m_e$. The y-coordinate of an electron that is initially at the boundary with a gryophase angle such that its velocity is in the +y-direction is given as a function of time by $$y(t) = y_{bd} + \rho_1 \sin(\Omega_1 t), \quad 0 \leq t \leq \pi/\Omega_1, \text{ where}$$

$$\rho_1 = v_\perp/\Omega_1 \text{ and } \Omega_1 = eB_1/m_e.$$

After half a gyroperiod the electron enters the region where $B = B_2$; and its y-position is then given in time by $y(t) = y_{bd} - \rho_2 \sin(\Omega_2 t)$, $\pi/\Omega_1 \leq t \leq \pi/\Omega_2$. Averaged over a complete gyroperiod, the y-position of the electron, relative to the boundary, is given by $$\langle y - y_{bd}\rangle = 2(\rho_1 - \rho_2)/\pi = (2m_e/\pi e)v_\perp(B_1^{-1} - B_2^{-1}).$$

For the assumed field, $B_1 > B_2$, and $\langle y - y_{bd}\rangle < 0$; that is, the gyro-averaged position of the electron is displaced toward the region of lower magnetic field strength. Additionally, if the initial gryophase angle, $\phi_0$, is such that the initial electron velocity is in the $\pm x$ direction, so that the electron remains in Region 2 or Region 1, respectively, then $$\langle y - y_{bd}\rangle = -\rho_2, \text{ if } v_{x0} > 0 + \rho_1, \text{ if } v_{x0} < 0.$$

For arbitrary values of the initial gyrophase angle, one can readily demonstrate that the average over a complete gyration of the y-coordinate of the electron, relative to the gyroradius in Region 1, is given by $$\langle y - y_0\rangle/\rho_1 = \{2\cos\phi_0(\Omega_2/\Omega_1 - \Omega_1/\Omega_2) -$$

$$\sin\phi_0[(\Omega_2/\Omega_1)(\pi - 2\phi_0) +$$

$$(\Omega_1/\Omega_2)(\pi + 2\phi_0)]\}/[(\Omega_2/\Omega_1)(\pi - 2\phi_0) +$$

$$\pi + 2\phi_0], \, 0 \leq \phi_0 \leq \pi/2$$

$$= \{-2\cos\phi_0(\Omega_2/\Omega_1 - \Omega_1/\Omega_2) -$$

$$\sin\phi_0[(\Omega_2/\Omega_1)(2\phi_0 - \pi) +$$

$$(\Omega_1/\Omega_2)(3\pi - 2\phi_0)]\}/[(\Omega_2/\Omega_1)(2\phi_0 - \pi) +$$

$$3\pi - 2\rho_0], \, \pi/2 \leq \phi_0 \leq 3\pi/2$$

$$= \{2\cos\phi_0(\Omega_2/\Omega_1 - \Omega_1/\Omega_2) -$$

$$\sin\phi_0[\Omega_2/\Omega_1)(5\pi - 2\phi_0) +$$

-continued $$(\Omega_1/\Omega_2)(2\phi_0 - 3\pi)]\}/[(\Omega_2/\Omega_1)(5\pi - 2\phi_0) -$$

$$3\pi + 2\phi_0], 3\pi/2 \leq \phi_0 \leq 2\pi.$$

This is displayed if FIG. 7 for an illustrative case with $\Omega_2 = 2\Omega_1/3$. It seems clear from the figure that the gyrophase average of $<y - y_{bd}>$ will be negative if $B_2 < B_1$; and this expectation is borne out by numerical evaluation of this gyrophase average, as indicated in FIG. 8.

In order to make this heuristic picture more rigorous, we have numerically integrated electron orbits in an inhomogeneous magnetic field given by $$B(y) = B_0[1 + (y - y_0)/L]\hat{e}_z$$

and evaluated the initial gyrophase average of the gyro-period averaged y-coordinate, $<<(y-y_0)/\rho_0>>$. The results for the case in which $\rho_0/L = 0.15$ are shown in FIG. 9 and FIG. 10. FIG. 9 shows the gyro-period averaged displacement as a function of the initial gyrophase angle; and FIG. 10 shows the average over initial gyrophase for a range of values of $\rho_0/L$. From this data we find $$<<(y-y_0)/\rho_0>> = -\rho_0/3L;$$

so that $$<<(y-y_0)>> = -\rho_0^2/3L.$$

If electron scattering continuously changes the gyrophase angle at a rate $\nu_\phi$, the electron will move in the direction of decreasing magnetic field strength at a rate $$<<dy/dt>> = -\rho_0^2 \nu_\phi/3L.$$

An alternative view of this mechanism can be obtained from the momentum transfer equation of magnetohydrodynamics:

$$n_e m_e (dv/dt) = -\nabla p - e n_e E + j \times B + F_{vis}.$$

Here $n_e$ is the density of the stream of precessing electrons, and p is their pressure, assumed isotropic. For the present purposes we replace the complete viscous force term, $F_{vis}$, by a rudimentary estimate:

$$F_{vis} = -\nu_{vis} n_e m_e v_x \hat{e}_x.$$

Then in steady state, from the momentum transfer equation, $$0 = -\nabla p - e n_e E + j \times B - \nu_{vis} n_e m_e v_x \hat{e}_x.$$

Taking the vector product with B then gives $$0 = -B \times \nabla p - e n_e B \times E + B \times (j \times B) - \nu_{vis} n_e m_e B V_x \hat{e}_y.$$

Assuming that $\nabla p = p' e_y$ and $E = E e_y$, we obtain from the y-component of this equation $$j_y = \nu_{vis} n_e m_e v_x/B = \nu_{vis} n_e m_e^2 v_\perp^2/(2eB^2 L)$$
$$= -e n_e <v_y>.$$

Thus, $$<v_y> = -\nu_{vis}\rho^2/2L.$$

The two estimates of gradient driven flow agree if $\nu_{vis} = 2\nu_\phi/3$.

Accordingly, various theoretical considerations noted above are believed to further illustrate novelty in the method and apparatus of the present invention as described hereinabove. Various modifications and additions to the method and apparatus are believed apparent in addition to those specifically described above. Accordingly, the scope of the present invention is defined only by the following appended claims which are also set forth by way of example.

What is claimed is:

1. A method of generating plasma by electron cyclotron resonant (ECR) heating to treat specimens by processes including surface treatment, comprising the steps of
    forming a cylindrical chamber, introducing a gaseous medium into the chamber and maintaining low gas pressure within the chamber,
    supporting one of the specimens in the chamber, and generating a continuous magnetic field and a continuous resonant interaction region in the chamber facing the specimen, and
    uniformly radiating electromagnetic radiation by forming a rectilinear array of interleaved linear magnets and at least one pair o microwave power injector segments having multiple injection axes extending into the chamber and toward the specimen for developing a plasma stream flow toward the specimen with characteristics of high plasma density, uniformity over transverse dimensions larger than the specimen, low plasma temperature and absence of energetic particles resulting from plasma instabilities even with operating gas pressures as low as $10^{-5}$ Torr.

2. The method of claim 1 further comprising the step of selecting the rectilinear array for ensuring uniform surface treatment of specimens with very large and/or curved surface.

3. An electron cyclotron resonance (ECR) plasma source for use in treating specimens by processes including chemical vapor deposition and etching, comprising
    a cylindrical chamber which is symmetrical about its longitudinal axis,
    means for supporting a specimen adjacent one axial end of the cylindrical chamber,
    means for introducing a gaseous medium into the chamber,
    two cylindrical magnet assemblies arranged circumferentially about the chamber for generating a circumferentially continuous and symmetrical magnetic field having lines of force forming continuous annular lobes also circumferentially extending about the chamber and continuous resonant interaction regions encircling the longitudinal axis of the chamber adjacent an opposite axial end thereof,
    means for developing a substantially field free region adjacent the one axial end of the chamber while minimizing extension of magnetic field force lines into the magnetic field free region and toward the specimen,
    a microwave power applicator arranged between the magnet assemblies and comprising at least one pair of slotted waveguide antennae each formed in an arcuate configuration, the paired antennae each having an injection axis extending radially inwardly toward the longitudinal axis of the chamber for uniformly radiating electromagnetic radiation toward the resonant interaction region about the entire periphery of the chamber so that plasma electrons made energetic by interaction with the electromagnetic radiation are not permitted line-of-sight communication to the specimen along field force lines in the magnetic field free region, and means for maintaining low gas pressure in the chamber, whereby a plasma stream flows through the magnetic field free region toward the specimen with characteristics of high plasma density, uniformity over transverse dimensions larger than the specimen, low plasma temperature and absence of energetic particles resulting from plasma instabilities even with operating gas pressures as low as $10^{-5}$ Torr.

4. The ECR plasma source of claim 1 further comprising a hybrid coupler for supplying microwave power to the paired antennae while providing a stable match to variable impedance of the plasma.

5. The ECR plasma source of claim 1 further comprising a fused quartz liner defining walls of the chamber for minimizing introduction of impurities into the chamber from interaction of electrons with the chamber walls.

6. The ECR plasma source of claim 5 further comprising means associated with the permanent magnets for final adjustment of the magnetic field configuration.

7. The ECR plasma source of claim 6 wherein the final adjustment means comprise annular magnetic bands movably positioned respectively adjacent the two cylindrical magnet assemblies.

8. The ECR plasma source of claim 1 further comprising means associated with the permanent magnets for final adjustment of the magnetic field configuration.

9. The ECR plasma source of claim 8 wherein the final adjustment means comprise annular magnetic bands movably positioned respectively adjacent the two cylindrical magnet assemblies.

10. The ECR plasma source of claim 1 wherein the chamber has all-metallic surfaces.

11. An electron cyclotron resonance (ECR) plasma source for use in treating specimens by processes including chemical vapor deposition and etching, comprising a cylindrical chamber which is symmetrical about its longitudinal axis, means for supporting one of the specimens adjacent one axial end of the cylindrical chamber, means for introducing a gaseous medium into the chamber, two cylindrical magnet assemblies arranged circumferentially about the chamber for generating a circumferentially continuous and symmetrical magnetic field having lines of force forming continuous annular lobes also circumferentially extending about the chamber and continuous resonant interaction regions encircling the longitudinal axis of the chamber adjacent an opposite axial end thereof, means for developing a substantially field free region adjacent the one axial end of the chamber while minimizing extension of magnetic field force lines into the magnetic field free region and toward the specimen, a microwave power applicator arranged between the magnet assemblies and having multiple injection axes extending radially inwardly toward the longitudinal axis of the chamber and thereby radiating electromagnetic radiation toward the resonant interaction region about the entire periphery of the chamber, means for maintaining low gas pressure in the chamber, and means associated with the permanent magnets for final adjustment of the magnetic field configuration, whereby a plasma stream flows through the magnetic field free region toward the specimen with characteristics of high plasma density, uniformity over transverse dimensions larger than the specimen, low plasma temperature and absence of energetic particles resulting from plasma instabilities even with operating gas pressures as low as $10^{-5}$ Torr.

12. The ECR plasma source of claim 11 wherein the final adjustment means comprises further comprising annular magnetic bands movably positioned respectively adjacent the two cylindrical magnet assemblies.

13. An electron cyclotron resonance (ECR) plasma source for use in treating specimens by processes including surface treatment, comprising a cylindrical chamber including means for introducing a gaseous medium into the chamber and means for maintaining low gas pressure in the chamber, means for supporting a specimen in the chamber, and a rectilinear array of interleaved linear magnets and at least one pair of microwave power injector segments having multiple injection axes extending into the chamber and toward the specimen, the rectilinear array being effective for developing a plasma stream flow toward the specimen with characteristics of high plasma density, uniformity over transverse dimensions larger than the specimen, low plasma temperature and absence of energetic particles resulting from plasma instabilities even with operating gas pressures as low as $10^{-5}$ Torr.

14. The ECR plasma source of claim 13 wherein the injector segments are linear slotted waveguide antennae.

15. The ECR plasma source of claim 14 further comprising a magnetic shell for mounting the rectilinear array.

16. The ECR plasma source of claim 15 wherein the magnetic shell is formed from milled steel.

17. The ECR plasma source of claim 13 further comprising a magnetic shell for mounting the rectilinear array.

* * * * *